US012136363B2

(12) United States Patent
Park et al.

(10) Patent No.: US 12,136,363 B2
(45) Date of Patent: Nov. 5, 2024

(54) FLEXIBLE DISPLAY DEVICE INCLUDING THIN FILM ENCAPSULATION PATTERNS

(71) Applicant: SAMSUNG DISPLAY CO., LTD., Yongin-si (KR)

(72) Inventors: Sunghyun Park, Yongin-si (KR); Minhwan Choi, Yongin-si (KR); Hyukjin Kim, Yongin-si (KR); Seungsuk Yang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 378 days.

(21) Appl. No.: 16/926,966

(22) Filed: Jul. 13, 2020

(65) Prior Publication Data

US 2021/0020078 A1    Jan. 21, 2021

(30) Foreign Application Priority Data

Jul. 19, 2019  (KR) .................. 10-2019-0087765

(51) Int. Cl.
*H10K 50/84* (2023.01)
*G09F 9/30* (2006.01)
*H10K 50/844* (2023.01)
*H10K 59/12* (2023.01)
*G02F 1/1333* (2006.01)
(Continued)

(52) U.S. Cl.
CPC .......... *G09F 9/301* (2013.01); *H10K 50/844* (2023.02); *G02F 1/133305* (2013.01); *H10K 59/121* (2023.02); *H10K 77/111* (2023.02); *H10K 2102/00* (2023.02); *H10K 2102/311* (2023.02)

(58) Field of Classification Search
CPC ............. H01L 51/5253; H01L 51/0097; H01L 2251/301; H01L 2251/5338; H01L 27/3276; H01L 27/3258; H01L 27/32; G02F 1/133305; G09G 9/301; H10K 50/844; H10K 50/8445; H10K 59/131; H10K 59/124; H10K 59/00; H10K 77/111;
(Continued)

(56) References Cited

U.S. PATENT DOCUMENTS 5,641,611 A  *  6/1997  Shieh ................... H10K 71/166
                                                        257/89
5,953,587 A  *  9/1999  Forrest .................. H10K 59/32
                                                        257/89
(Continued)

FOREIGN PATENT DOCUMENTS

JP        2017201393 A    11/2017
KR     1020170078175 A     7/2017
(Continued)

*Primary Examiner* — Ida M Soward
(74) *Attorney, Agent, or Firm* — CANTOR COLBURN LLP

(57) ABSTRACT

A flexible display device includes a substrate which is bendable or rollable based on an axis, a plurality of display elements on the substrate, and a plurality of thin-film encapsulation patterns which covers the plurality of display elements, where the plurality of thin-film encapsulation patterns includes a first thin-film encapsulation pattern and a second thin-film encapsulation pattern, which are apart from each other in a direction crossing the axis, and each of the first thin-film encapsulation pattern and the second thin-film encapsulation pattern extends in parallel to the axis of the flexible display device.

16 Claims, 10 Drawing Sheets

(51) Int. Cl.
*H10K 59/121* (2023.01)
*H10K 77/10* (2023.01)
*H10K 102/00* (2023.01)

(58) Field of Classification Search
CPC ............ H10K 2102/00; H10K 59/121; H10K 2102/311
See application file for complete search history.

(56) References Cited

U.S. PATENT DOCUMENTS

| | | | | |
|---|---|---|---|---|
| 6,013,538 | A * | 1/2000 | Burrows | H10K 50/125 |
| | | | | 438/22 |
| 6,069,443 | A * | 5/2000 | Jones | H10K 59/173 |
| | | | | 313/506 |
| 6,582,888 | B1 * | 6/2003 | Herbst | H10K 59/173 |
| | | | | 430/315 |
| 9,632,487 | B2 * | 4/2017 | Kim | H10K 59/1213 |
| 10,050,098 | B2 | 8/2018 | Nam et al. | |
| 10,135,025 | B2 | 11/2018 | Kim et al. | |
| 10,198,041 | B2 | 2/2019 | Myeong et al. | |
| 10,198,974 | B2 | 2/2019 | Yun et al. | |
| 10,254,796 | B2 | 4/2019 | Isa et al. | |
| 10,319,944 | B2 | 6/2019 | Lee et al. | |
| 10,454,067 | B2 * | 10/2019 | Seo | H10K 59/65 |
| 10,541,380 | B1 * | 1/2020 | Sung | H01L 51/0097 |
| 10,615,369 | B2 * | 4/2020 | Choi | H10K 50/844 |
| 10,748,974 | B2 * | 8/2020 | Lee | H10K 59/122 |
| 11,063,237 | B2 | 7/2021 | Kim et al. | |
| 11,094,760 | B2 * | 8/2021 | Jeon | H10K 71/233 |
| 2015/0097171 | A1 * | 4/2015 | Kim | H10K 50/824 |
| | | | | 438/23 |
| 2016/0079564 | A1 * | 3/2016 | Shim | H01L 27/3246 |
| | | | | 257/40 |
| 2017/0031323 | A1 * | 2/2017 | Kim | H10K 59/1213 |
| 2017/0125728 | A1 * | 5/2017 | Dighde | H01L 27/3258 |
| 2017/0146845 | A1 * | 5/2017 | Kim | G02F 1/133377 |
| 2017/0148856 | A1 * | 5/2017 | Choi | H10K 50/844 |
| 2017/0150618 | A1 * | 5/2017 | Choi | H02J 50/10 |
| 2017/0221982 | A1 * | 8/2017 | Park | H01L 51/0097 |
| 2017/0237038 | A1 * | 8/2017 | Kim | H01L 51/0096 |
| | | | | 257/40 |
| 2018/0190734 | A1 | 7/2018 | Kang et al. | |
| 2019/0051859 | A1 * | 2/2019 | Choi | H10K 59/123 |
| 2019/0081273 | A1 * | 3/2019 | Sung | H10K 50/844 |
| 2019/0148672 | A1 * | 5/2019 | Seo | H10K 50/8445 |
| | | | | 257/40 |
| 2019/0288047 | A1 * | 9/2019 | Jeong | H10K 59/124 |
| 2019/0334120 | A1 * | 10/2019 | Seo | H10K 59/121 |
| 2019/0355930 | A1 * | 11/2019 | Lee | H10K 50/8445 |
| 2020/0006700 | A1 * | 1/2020 | Kim | H01L 27/3258 |
| 2020/0006701 | A1 * | 1/2020 | Lee | H01L 27/3258 |
| 2020/0106045 | A1 * | 4/2020 | Han | H10K 59/65 |
| 2020/0119304 | A1 * | 4/2020 | Choi | H01L 51/52 |
| 2020/0161582 | A1 * | 5/2020 | Choi | H01L 51/5253 |
| 2020/0176538 | A1 * | 6/2020 | Um | H10K 59/131 |
| 2020/0176709 | A1 * | 6/2020 | Moon | G06F 3/0412 |
| 2020/0203660 | A1 * | 6/2020 | Shi | H01L 51/0096 |
| 2020/0212353 | A1 * | 7/2020 | Kim | H10K 50/8426 |
| 2020/0243791 | A1 * | 7/2020 | Campbell | H01L 21/0274 |
| 2021/0151715 | A1 * | 5/2021 | Lee | H01L 27/3258 |
| 2021/0234122 | A1 * | 7/2021 | Choi | H01L 51/56 |
| 2021/0234125 | A1 * | 7/2021 | Sung | H01L 27/3258 |
| 2021/0273026 | A1 * | 9/2021 | Seo | H01L 51/0096 |
| 2021/0320276 | A1 * | 10/2021 | Chang | H01L 27/3258 |
| 2021/0359269 | A1 * | 11/2021 | Seo | H10K 50/856 |
| 2021/0408450 | A1 * | 12/2021 | Wang | H01L 51/5253 |

FOREIGN PATENT DOCUMENTS

| | | |
|---|---|---|
| KR | 1020170096646 A | 8/2017 |
| KR | 1020170120062 A | 10/2017 |
| KR | 1020180039220 A | 4/2018 |
| KR | 1020180042485 A | 4/2018 |
| KR | 101872963 B1 | 6/2018 |
| KR | 1020180063962 A | 6/2018 |
| KR | 1020180078859 A | 7/2018 |
| KR | 1020190018120 A | 2/2019 |

\* cited by examiner

FLEXIBLE DISPLAY DEVICE INCLUDING THIN FILM ENCAPSULATION PATTERNS

This application claims priority to Korean Patent Application No. 10-2019-0087765, filed on Jul. 19, 2019, and all the benefits accruing therefrom under 35 U.S.C. § 119, the content of which in its entirety is herein incorporated by reference.

BACKGROUND

1. Field

One or more embodiments relate to a flexible display device.

2. Description of Related Art

Recently, a display device have been widely used in various fields. In particular, the thickness and weight of the display device have decreased, and a flexible display device, in which at least a partial area thereof is bendable, rollable or foldable, has been introduced into the market considering spatial utility.

SUMMARY

A flexible display device may include an inorganic material layer. Because the inorganic material layer is vulnerable to stress by external force, cracks may occur in the inorganic material layer due to repeated operations of bending or folding the flexible display device.

One or more embodiments include a flexible display device in which durability may be maintained even in repeated operations of bending or folding the flexible display device.

According to an embodiment, a flexible display device includes a substrate which is bendable or rollable based on an axis, a plurality of display elements on the substrate, and a plurality of thin-film encapsulation patterns which covers the plurality of display elements, where the plurality of thin-film encapsulation patterns includes a first thin-film encapsulation pattern and a second thin-film encapsulation pattern, which are apart from each other in a direction crossing the axis, and each of the first thin-film encapsulation pattern and the second thin-film encapsulation pattern extends in parallel to the axis of the flexible display device.

In an embodiment, each of the first thin-film encapsulation pattern and the second thin-film encapsulation pattern may include an organic encapsulation layer and an inorganic encapsulation layer.

In an embodiment, each of the first thin-film encapsulation pattern and the second thin-film encapsulation pattern may include a first inorganic encapsulation layer, an organic encapsulation layer, and a second inorganic encapsulation layer, which are sequentially stacked one on another. In such an embodiment, the organic encapsulation layer of the first thin-film encapsulation pattern and the organic encapsulation layer of the second thin-film encapsulation pattern may be apart from each other, and the second inorganic encapsulation layer of the first thin-film encapsulation pattern and the second inorganic encapsulation layer of the second thin-film encapsulation pattern may be apart from each other.

In an embodiment, the first inorganic encapsulation layer of the first thin-film encapsulation pattern and the first inorganic encapsulation layer of the second thin-film encapsulation pattern may be connected to each other.

In an embodiment, the flexible display device may further include a first organic insulating layer between the substrate and the display elements, and an opening is defined through a portion of the first organic insulating layer between the first thin-film encapsulation pattern and the second thin-film encapsulation pattern.

In an embodiment, each of the plurality of display elements may include a pixel electrode, an emission layer on the pixel electrode, and an opposite electrode on the emission layer. In such an embodiment, opposite electrodes of adjacent display elements may be disconnected or separated from each other between the first thin-film encapsulation pattern and the second thin-film encapsulation pattern.

In an embodiment, a groove having an undercut structure may be defined between the first thin-film encapsulation pattern and the second thin-film encapsulation pattern, and the opposite electrodes of the adjacent display elements may be disconnected or separated from each other by the groove.

In an embodiment, each of the plurality of display elements may further include a functional layer between the pixel electrode and the opposite electrode. In such an embodiment, the functional layer of each of the plurality of display elements may be disconnected or separated from the functional layer of an adjacent display element thereof by the groove.

In an embodiment, the flexible display device may further include a separator between the first thin-film encapsulation pattern and the second thin-film encapsulation pattern and having a reversely-tapered inclined surface, and the opposite electrodes of the adjacent display elements may be disconnected or separated from each other by the separator.

In an embodiment, each of the plurality of display elements may further a functional layer between the pixel electrode and the opposite electrode. In such an embodiment, the functional layer of each of the plurality of display elements may be disconnected or separated from the functional layer of an adjacent display element thereof by the separator.

According to an embodiment, a flexible display device includes a substrate which is bendable or rollable based on an axis, a plurality of display elements on the substrate, a plurality of thin-film encapsulation patterns which covers the plurality of display elements and is arranged to be apart from one another in a direction crossing the axis, where a groove is defined between adjacent thin-film encapsulation patterns of the plurality of thin-film encapsulation patterns.

In an embodiment, each of the plurality of display elements may include a pixel electrode, an emission layer on the pixel electrode, and an opposite electrode on the emission layer, and opposite electrodes of adjacent display elements of the plurality of display elements may be disconnected or separated from each other by the groove.

In an embodiment, each of the plurality of display elements may further include a functional layer between the pixel electrode and the opposite electrode. In such an embodiment, the functional layer of each of the plurality of display elements may be integrally formed as a single unitary unit and may be disconnected or separated from the functional layer of an adjacent display element thereof by the groove.

In an embodiment, each of the plurality of thin-film encapsulation patterns may include a first inorganic encapsulation layer, an organic encapsulation layer, and a second inorganic encapsulation layer, which are sequentially stacked one on another, and first inorganic encapsulation layers of the adjacent thin-film encapsulation patterns may be connected to each other.

In an embodiment, organic encapsulation layers of the adjacent thin-film encapsulation patterns may be apart from each other between the adjacent thin-film encapsulation patterns, and second inorganic encapsulation layers of the adjacent thin-film encapsulation patterns may be apart from each other.

According to an embodiment, a flexible display device includes a substrate which is bendable or rollable based on an axis, a plurality of display elements on the substrate, a plurality of thin-film encapsulation patterns which covers the plurality of display elements and is arranged to be apart from one another in a direction crossing the axis, and a separator between adjacent thin-film encapsulation patterns of the plurality of thin-film encapsulation patterns.

In an embodiment, each of the plurality of display elements may include a pixel electrode, an emission layer on the pixel electrode, and an opposite electrode on the emission layer. In such an embodiment, the opposite electrode of each of the display elements may be integrally formed as a single unitary unit, and may be disconnected or separated from the opposite electrode of an adjacent display element thereof.

In an embodiment, each of the plurality of display elements may further include a functional layer between the pixel electrode and the opposite electrode. In such an embodiment, the functional layer of each of the plurality of display elements may be integrally formed as a single unitary unit, and may be disconnected or separated from the functional layer of the adjacent display element thereof.

In an embodiment, each of the plurality of thin-film encapsulation patterns may include a first inorganic encapsulation layer, an organic encapsulation layer and a second inorganic encapsulation layer, and first inorganic encapsulation layers of the adjacent thin-film encapsulation patterns may be connected to each other.

In an embodiment, organic encapsulation layers of the adjacent of thin-film encapsulation patterns may be apart from each other, and second inorganic encapsulation layers of the adjacent thin-film encapsulation patterns may be apart from each other.

BRIEF DESCRIPTION OF THE DRAWINGS

The above and other features of embodiments of the disclosure will be more apparent from the following description taken in conjunction with the accompanying drawings, in which.

DETAILED DESCRIPTION

Figure 1A:
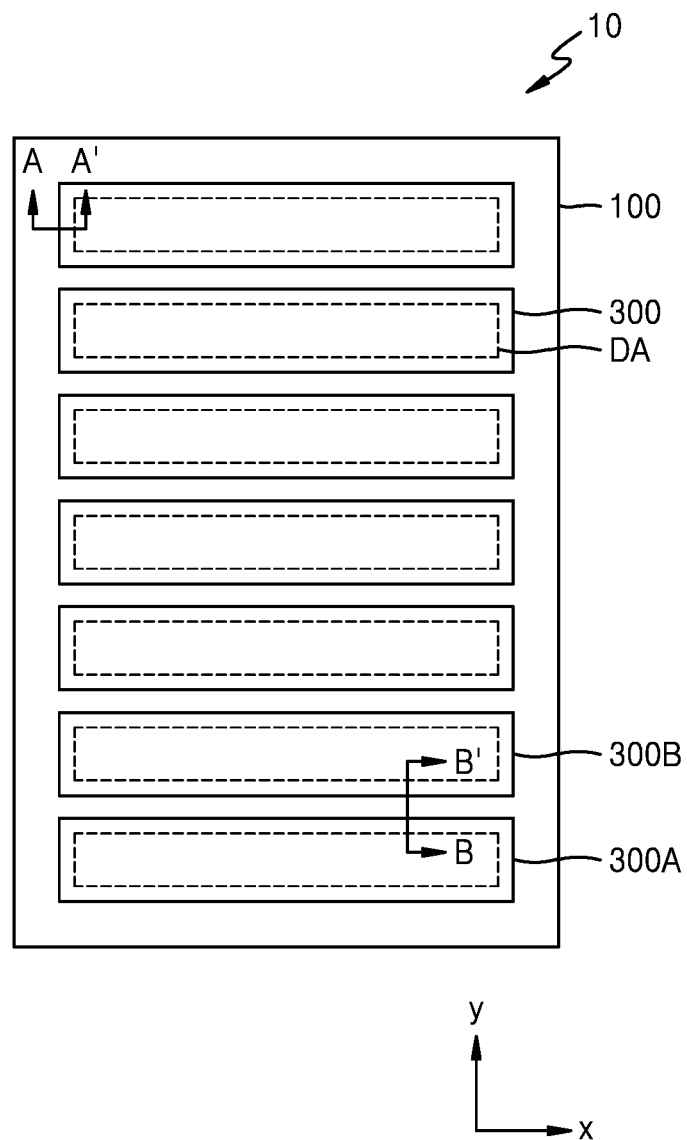
FIG. 1A is a plan view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will understood that when a layer, region, or component is referred to as being "on," another layer, region, or component, it may be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will understood that when a layer, region, or component is referred to as being "connected to," another layer, region, or component, it may be directly or indirectly connected to the other layer, region, or component. That is, for example, intervening layers, regions, or components may be present. For example, it will understood that when a layer, region, or component is referred to as being "electrically connected to," another layer, region, or component, it may be directly or indirectly electrically connected to the other layer, region, or component. That is, for example, intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Hereinafter, embodiments of the invention will be described in detail with reference to the accompanying drawings.

Figure 1B:
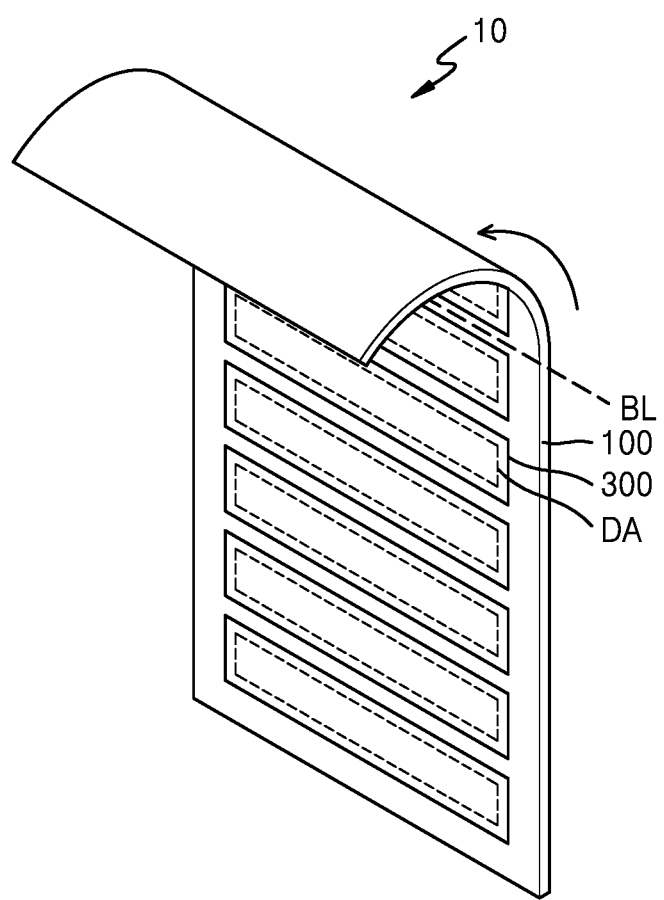
FIG. 1B is a plan view schematically illustrating a display device according to an embodiment.

FIGS. 1A and 1B are plan views schematically illustrating a display device 10 according to an embodiment.

Referring to FIGS. 1A and 1B, an embodiment of the display device 10 may include a flexible display device that may be bendable or rollable based on a predetermined axis BL. In one embodiment, for example, the display device 10 may be rollable or foldable based on an axis BL (may also be referred to as a bending or rolling axis) as shown in FIG. 1B. In one embodiment, for example, the axis BL may be parallel to a width direction of the display device 10.

In an embodiment, the display device 10 may include a plurality of display areas DA in which a plurality of pixels are arranged on a substrate 100. The display areas DA are a kind of pixel groups in which a plurality of pixels are arranged. In an embodiment, the plurality of display areas DA may be arranged to be apart from one another in a predetermined direction, as shown in FIG. 1A. The display device 10 may output an image to an outside based on light emitted from the plurality of pixels in each of the display areas DA.

Each of the plurality of pixels may include a display element and a pixel circuit connected to the display element. The pixel circuit may be electrically connected to a signal line and a power line and may control the display element to emit red, green, blue or white light.

The display element may include one of an organic light-emitting diode, an inorganic light-emitting diode and a quantum dot light-emitting diode, or may be one of other various types of display element. Hereinafter, for convenience of description, embodiment where a display element of each of the pixels includes an organic light-emitting diode will be described in detail.

Pixels in each display area DA may be covered by a plurality of thin-film encapsulation patterns 300 that are respectively disposed to correspond to the display areas DA to prevent penetration of moisture from the outside. Each of the plurality of thin-film encapsulation patterns 300 may include a first length that extends in a direction parallel to the axis BL of the display device 10, and a first width that extends in a direction crossing the axis BL. The plurality of thin-film encapsulation patterns 300 may be arranged to be apart from one another in the direction crossing the axis BL. In one embodiment, for example, the plurality of thin-film encapsulation patterns 300 may include a first thin-film encapsulation pattern 300A and a second thin-film encapsulation pattern 300B, which are apart from each other in the direction crossing the axis BL. Each of the thin-film encapsulation patterns 300 may include an organic encapsulation layer and an inorganic encapsulation layer.

Figure 2:
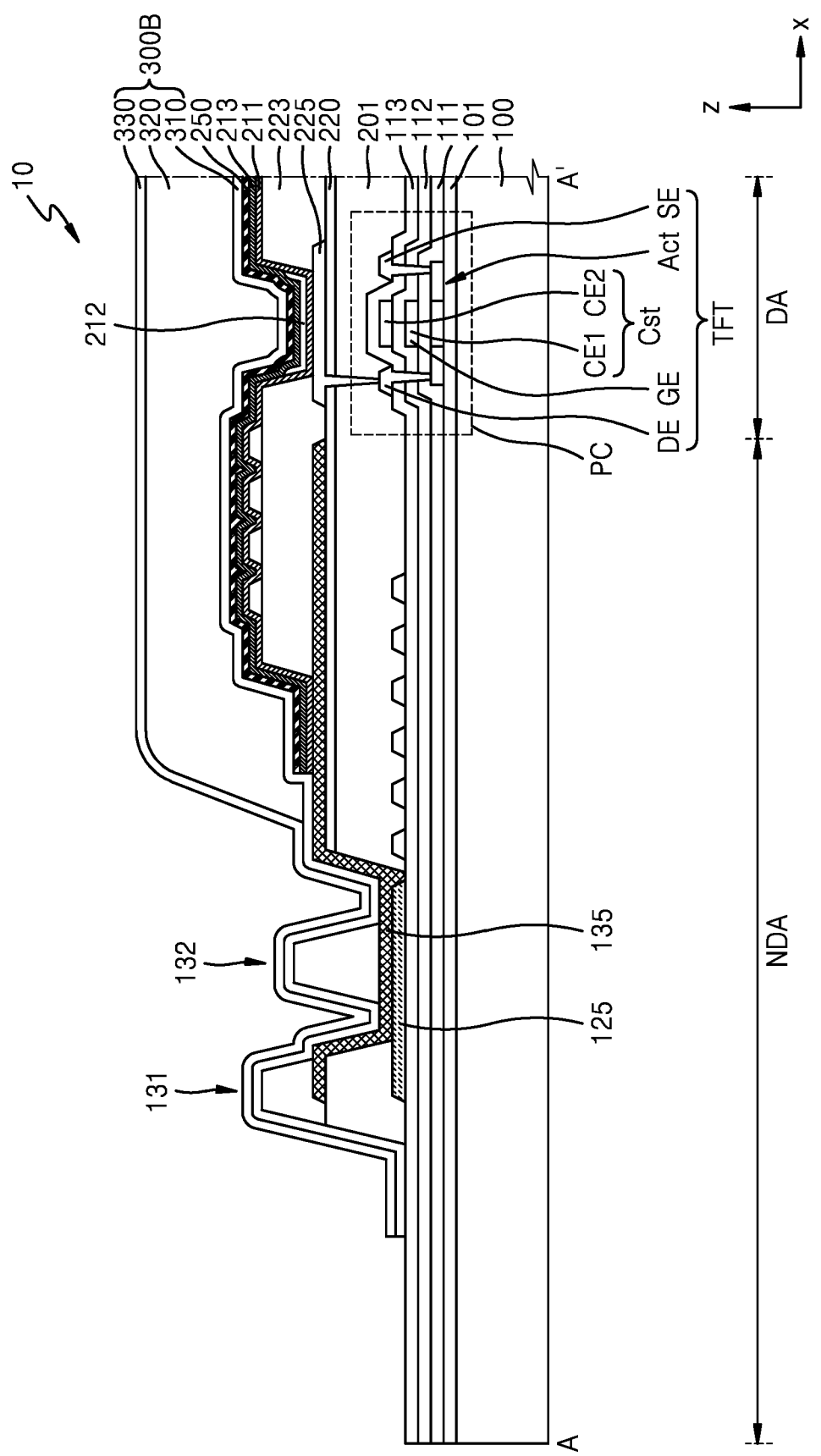
FIG. 2 is a cross-sectional view of a display device according to an embodiment.

FIG. 2 is a cross-sectional view of the display device 10 according to an embodiment. Particularly, FIG. 2 may correspond to a cross-section of the display device 10 taken along line A-A' of FIG. 1A.

First, the display areas DA of FIG. 2 will be described in detail.

In an embodiment, the display device 10 may include a display element on the substrate 100. A plurality of layers and a pixel circuit PC may be between the substrate 100 and the display element. The substrate 100 may include a polymer resin. The polymer resin may include at least one material selected from polyethersulfone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate ("PC") and cellulose acetate propionate (CAP). The substrate 100 may have a structure in which a layer including the above-described polymer resin and a barrier layer including an inorganic insulating material are stacked one on another. In one embodiment, for example, the substrate 100 may include a first polymer resin layer, a first barrier layer, a second polymer resin layer, and a second barrier layer, which are sequentially stacked one on another.

A buffer layer 101 may be disposed on the substrate 100 and may prevent an impurity from penetrating into a semiconductor layer Act of a thin-film transistor TFT. In one embodiment, for example, the buffer layer 101 may include an inorganic insulating material, such as silicon oxide, silicon nitride and/or silicon oxynitride.

The pixel circuit PC may include the thin-film transistor TFT and a storage capacitor Cst. The thin-film transistor TFT may include the semiconductor layer Act, a gate electrode GE, a source electrode SE, and a drain electrode DE. The storage capacitor Cst may include a lower electrode CE1 and an upper electrode CE2, which overlap each other in a z-axis direction or a thickness direction of the substrate 100. In an embodiment, the gate electrode GE of the thin-film transistor TFT may function as the lower electrode CE1 of the storage capacitor Cst. In an embodiment, as shown in FIG. 2, the thin-film transistor TFT may be a top gate-type thin-film transistor, in which the gate electrode GE is disposed on the semiconductor layer Act with a gate insulating layer 111 between the gate electrode CE and the semiconductor layer Act, but not being limited thereto. Alternatively, the thin-film transistor TFT may be of a bottom gate-type thin-film transistor.

In an embodiment, the semiconductor layer Act may include polysilicon. Alternatively, the semiconductor layer Act may include amorphous silicon, an oxide semiconductor, or an organic semiconductor.

The gate electrode GE may include a low resistance metal material. In an embodiment, the gate electrode GE may include conductive materials including molybdenum (Mo), aluminum (Al), copper (Cu), and titanium (Ti) and may have a multi-layer or single layer structure including the materials described above.

The gate insulating layer 111 may be between the semiconductor layer Act and the gate electrode GE. The gate insulating layer 111 may include an inorganic insulating material, for example, silicon oxide, silicon nitride, silicon oxynitride, aluminum oxide, titanium oxide, tantalum oxide or hafnium oxide. The gate insulating layer 111 may have a single layer or multi-layer structure including the materials described above.

The source electrode SE and the drain electrode DE may include materials having high conductivity. The source electrode SE and the drain electrode DE may include conductive materials, such as Mo, Al, Cu, and Ti, and may have a multi-layer or single layer structure including the materials described above. In an embodiment, the source electrode SE and the drain electrode DE may have a multi-layer structure of Ti/Al/Ti.

The storage capacitor Cst may include a lower electrode CE1 and an upper electrode CE2, which overlap each other in the z-axis direction. The storage capacitor Cst may overlap the thin-film transistor TFT. In an embodiment, as described above, the gate electrode GE of the thin-film transistor TFT may be the lower electrode CE1 of the storage capacitor Cst. In an alternative embodiment, the storage capacitor Cst may not overlap the thin-film transistor TFT.

A first interlayer insulating layer 112 may be between the lower electrode CE1 and the upper electrode CE2 of the storage capacitor Cst, and a second interlayer insulating layer 113 may be on the upper electrode CE2 of the storage capacitor Cst.

The first interlayer insulating layer 112 and the second interlayer insulating layer 113 may include an inorganic insulating material, such as silicon oxide, silicon nitride, silicon oxynitride, aluminum oxide, titanium oxide, tantalum oxide or hafnium oxide. The first interlayer insulating layer 112 and the second interlayer insulating layer 113 may have a single layer or multi-layer structure including the materials described above.

The pixel circuit PC may be covered by a first organic insulating layer 201. The first organic insulating layer 201 may include an organic insulating material, such as general-purpose polymer such as poly(methyl methacrylate) ("PMMA") or polystyrene ("PS"), a polymer derivative having a phenol-based group, acryl-based polymer, imide-based polymer, aryl ether-based polymer, amide-based polymer, fluorine-based polymer, vinyl alcohol-based polymer, and a combination (e.g., a blend) thereof. In one embodiment, for example, the first organic insulating layer 201 may include PI.

A pixel electrode 225 may be on the first organic insulating layer 201. In an embodiment, the pixel electrode 225 may include indium tin oxide ("ITO"), indium zinc oxide ("IZO"), zinc oxide (ZnO), indium oxide ($In_2O_3$), indium gallium oxide, or aluminum zinc oxide ("AZO"). In an alternative embodiment, the pixel electrode 225 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination (e.g., a compound or an alloy) thereof. In another alternative embodiment, the pixel electrode 225 may further include a layer including ITO, IZO, ZnO, or $In_2O_3$, which is on or/and under the reflective layer described above.

A pixel-defining layer 223 may cover edges of the pixel electrode 225, and an opening for exposing a part of the pixel electrode 225 is defined through the pixel-defining layer 223. The pixel-defining layer 223 may increase a distance between ends of the pixel electrode 225 and an opposite electrode 250, thereby effectively preventing an arc therebetween from occurring. The pixel-defining layer 223 may include an organic insulating material, such as PI. Alternatively, the pixel-defining layer 223 may include an inorganic insulating materials, such as silicon nitride or silicon oxynitride, and silicon oxide. Alternatively, the pixel-defining layer 223 may include an organic insulating material and an inorganic insulating material.

An emission layer 212 may be disposed on the pixel-defining layer 223. The emission layer 212 may overlap the opening of the pixel-defining layer 223 and the pixel electrode 225 exposed through the opening of the pixel-defining layer 223. The emission layer 212 may include an organic material that emits light having a certain color. The emission layer 212 may include an organic material that emits red, green, or blue light. The organic material described above may include a polymer organic material or a small molecular weight organic material.

In an embodiment, although not shown in FIG. 2, at least one functional layer may be on and/or under the emission layer 212. In one embodiment, for example, a first functional layer may be positioned under the emission layer 212, and a second functional layer may be positioned on the emission layer 212. In one embodiment, for example, when the first functional layer includes a polymer material, the first functional layer may include a hole transport layer ("HTL") having a single layer structure and may include poly-(3,4)-ethylene-dihydroxy thiophene ("PEDOT") or polyaniline ("PANI"). In another embodiment, the first functional layer includes a small molecular weight material, the first functional layer may include a hole injection layer ("HIL") and an HTL. In one embodiment, for example, the second functional layer may be optionally positioned depending on whether the first functional layer and the emission layer 212 include polymer materials. The second functional layer may have a single layer or multi-layer structure. The second functional layer may include an electron transport layer ("ETL") and/or an electron injection layer ("EIL").

The opposite electrode 250 may include a conductive material having a small work function. In one embodiment, for example, the opposite electrode 250 may include a (semi-)transparent layer including Ag, Mg, Al, Pt, Pd, gold Au, Ni, Nd, Ir, Cr, lithium (Li), calcium (Ca), or an alloy thereof. Alternatively, the opposite electrode 250 may further include a layer, such as ITO, IZO, ZnO or $In_2O_3$, on the (semi-)transparent layer including the materials described above. The opposite electrode 250 may be formed in both the display area DA and the non-display area NDA.

A display element (e.g.: an organic light-emitting diode) including the pixel electrode 225, the emission layer 212, and the opposite electrode 250 may be covered by the thin-film encapsulation patterns 300. Each of the thin-film encapsulation patterns 300 may include an organic encapsulation layer and an inorganic encapsulation layer. In an embodiment, each of the thin-film encapsulation patterns 300 may include a first inorganic encapsulation layer 310, an organic encapsulation layer 320, and a second inorganic encapsulation layer 330.

The first inorganic encapsulation layer 310 and the second inorganic encapsulation layer 330 may include at least one inorganic insulating material, such as aluminum oxide, titanium oxide, tantalum oxide, hafnium oxide, zinc oxide, silicon oxide, silicon nitride, or silicon oxynitride, for example. The organic encapsulation layer 320 may include a polymer-based material. The polymer-based material may include silicon-based resin, acryl-based resin, epoxy-based resin, PI or polyethylene.

Referring to the non-display area NDA of FIG. 2, a barrier wall may be in the non-display area NDA. The barrier wall may limit the position of the organic encapsulation layer 320 in a process of forming the organic encapsulation layer 320. In one embodiment, for example, as shown in FIG. 2, a first barrier wall 131 of the barrier wall may be in the non-display area NDA. The first barrier wall 131 may be in the non-display area NDA and apart from the first organic insulating layer 201 by a predetermined distance.

The first barrier wall 131 may have a multi-layer stack structure in the z-axis direction. In an embodiment, the first barrier wall 131 may include a first layer and a second layer, which are stacked in the z-axis direction, i.e., to be far away from a portion close to the substrate 100. The first layer may be simultaneously formed using a same material when the first organic insulating layer 201 of the display area DA is formed. The second layer may be simultaneously formed using a same material when the pixel-defining layer 223 of the display area DA is formed.

A second barrier wall 132 of the barrier wall may be between the first barrier wall 131 and a distal end of the first organic insulating layer 201. In an embodiment, the second barrier wall 132 may be on a conductive connection layer 135 in a common voltage supply line 125. The second barrier wall 132 may be apart from the first organic insulating layer 201 by a predetermined distance and may be in the non-display area NDA. The height of the second barrier wall 132 from the substrate 100 may be less than that the height of the first barrier wall 131 from the substrate 100. The second barrier wall 132 may be simultaneously formed using a same material as the second layer of the first barrier wall 131.

The first barrier wall 131 or/and the second barrier wall 132 may define the position of the organic encapsulation layer 320. The organic encapsulation layer 320 may be formed by applying a material for forming the organic encapsulation layer 320 and by curing the material. The first barrier wall 131 or/and the second barrier wall 132 may control the flow of the material for forming the organic encapsulation layer 320.

In the non-display area NDA, the common voltage supply line 125 may be positioned on a stack structure of the substrate 100, the buffer layer 101, the gate insulating layer 111, the first interlayer insulating layer 112 and the second interlayer insulating layer 113. In an alternative embodiment, the gate insulating layer 111, the first interlayer insulating layer 112 or the second interlayer insulating layer 113 may be omitted.

The common voltage supply line 125 may be electrically connected to the opposite electrode 250 via the conductive connection layer 135. The conductive connection layer 135 may be disposed on the first organic insulating layer 201. The conductive connection layer 135 may be between the common voltage supply line 125 and the opposite electrode 250, and one side of the conductive connection layer 135 may extend into the common voltage supply line 125. In one embodiment, for example, the conductive connection layer 135 may cover at least a part of an upper portion of the common voltage supply line 125 that is not covered by the first organic insulating layer 201. The conductive connection layer 135 may be disposed in a same layer as the pixel electrode 225 or disposed directly on a layer on which the pixel electrode 225 is disposed directly. The conductive connection layer 135 may include a same material as the pixel electrode 225. In one embodiment, for example, the conductive connection layer 135 may include a conductive oxide, such as ITO, IZO, ZnO, $In_2O_3$, IGO, or AZO.

One side of the opposite electrode 250 may extend in the conductive connection layer 135 in the non-display area NDA. The opposite electrode 250 may overlap the conductive connection layer 135 and may be in direct contact therewith. The opposite electrode 250 may be electrically connected to the common voltage supply line 125 via the conductive connection layer 135, and a common voltage may be applied to the opposite electrode 250.

Figure 3A:
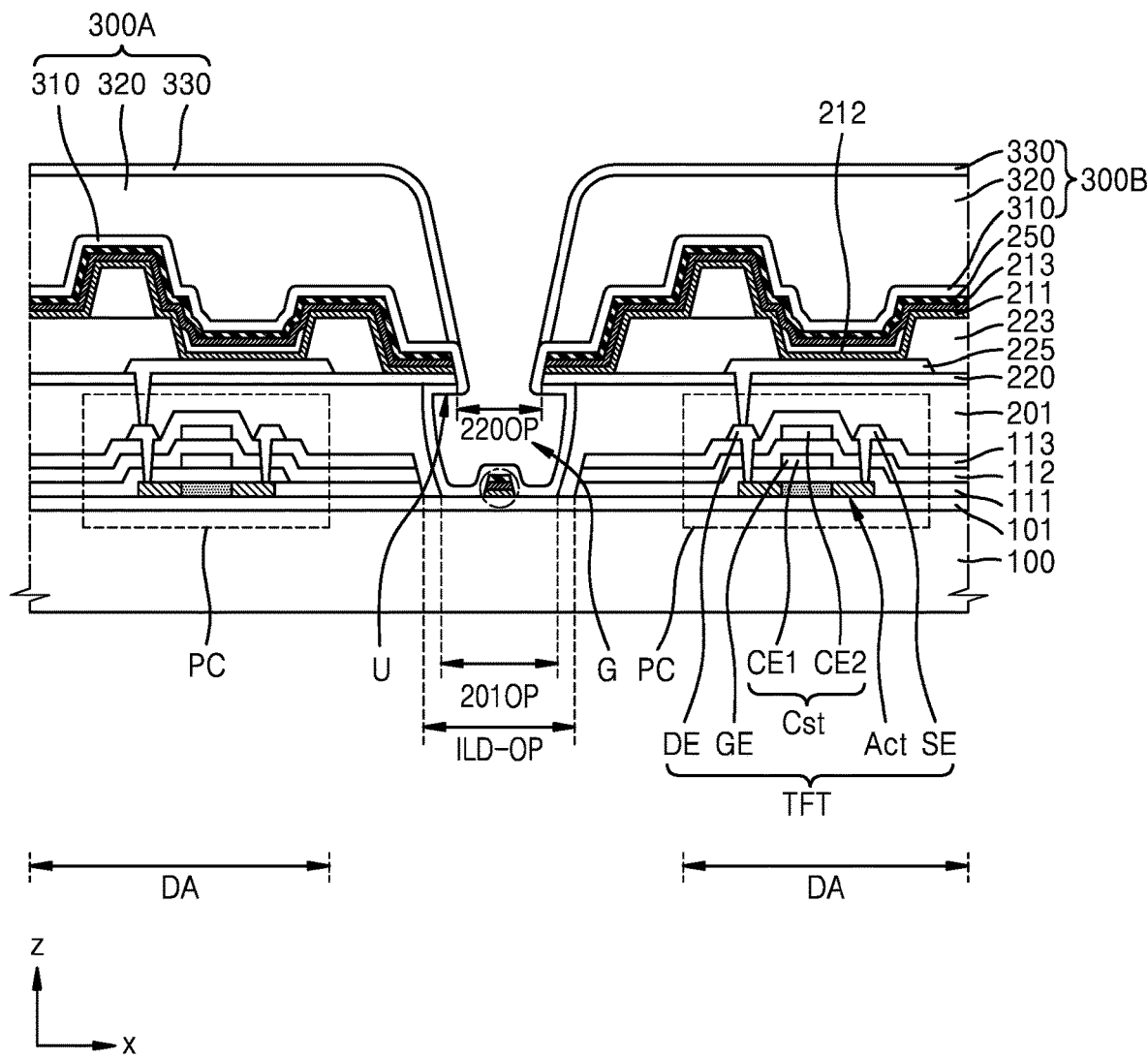
FIG. 3A is a cross-sectional view of a display device according to an embodiment.
Figure 3B:
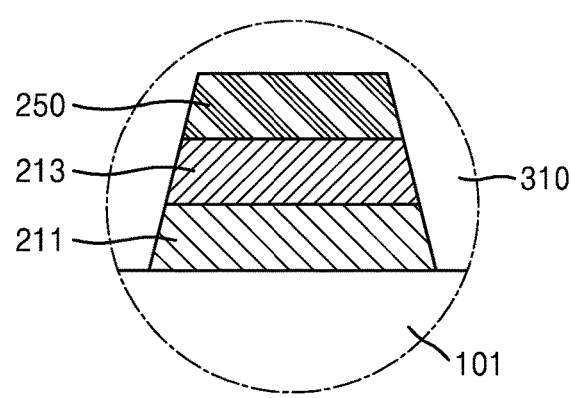
FIG. 3B is an enlarged view of the encircled portion of FIG. 3A.

FIG. 3A is a cross-sectional view of a display device 10 according to an embodiment, and FIG. 3B is an enlarged view of the encircled portion of FIG. 3A. Particularly, FIG. 3A may correspond to a cross-section of the display device 10 taken along line B-B' of FIG. 1A.

The pixel circuit PC and a display element connected to the pixel circuit PC are positioned to correspond to each display area DA. Display elements may be covered by the first thin-film encapsulation pattern 300A and the second thin-film encapsulation pattern 300B.

A groove G may be defined between the display areas DA. The groove G may be formed by an opening 201OP of the first organic insulating layer 201 and an opening 220OP of an inorganic material layer 220, which overlap each other in the z-axis direction. The opening 220OP of the inorganic material layer 220 may have a smaller width than a width of the opening 201OP of the first organic insulating layer 201. Ends for defining the opening 220OP of the inorganic material layer 220 on the first organic insulating layer 201 may further protrude toward the center of the opening 220OP than an inside of the first organic insulating layer 201 and thus may form a tip. The groove G may have an undercut structure.

In an embodiment, as shown in FIGS. 3A and 3B, the groove G having the undercut structure formed by the openings 220OP and 201OP of the inorganic material layer 220 and the first organic insulating layer 201 may disconnect or separate the opposite electrodes 250 from each other. In one embodiment, for example, the opposite electrodes 250 may be disconnected or separated from each other based on the groove G. The opposite electrode 250 may be formed using a thermal deposition. The opposite electrodes 250 may be disconnected or separated from each other by the undercut structure indicated with "U" of the groove G. The first functional layer 211 and/or the second functional layer 213 under the opposite electrodes 250 may be disconnected or separated from each other by the undercut structure U of the groove G.

An opening ILD-OP that overlaps the groove G may be defined through an inorganic layer (for example, the gate insulating layer 111, the first interlayer insulating layer 112 and the second interlayer insulating layer 113) under the first organic insulating layer 201. A width of the opening ILD-OP formed in at least one inorganic layer, that is, the gate insulating layer 111, the first interlayer insulating layer 112 and the second interlayer insulating layer 113, may be greater than the width of the opening 201OP of the first organic insulating layer 201.

The first and second thin-film encapsulation patterns 300A and 300B may include an encapsulation layer and an inorganic encapsulation layer. In one embodiment, for example, each of the first and second thin-film encapsulation patterns 300A and 300B may include a structure in which the first inorganic encapsulation layer 310, the organic encapsulation layer 320 and the second inorganic encapsulation layer 330 are sequentially stacked one on another, as shown in FIG. 3A. In the first and second thin-film encapsulation patterns 300A and, the number of organic encapsulation layers, the number of inorganic encapsulation layers, and a stack order may be variously modified to be different from the numbers and the order of those shown in FIG. 3A.

The organic encapsulation layer 320 of the first thin-film encapsulation pattern 300A and the organic encapsulation layer 320 of the second thin-film encapsulation pattern 300B may be apart from each other. In one embodiment, for example, the organic encapsulation layer 320 of the first thin-film encapsulation pattern 300A and the organic encapsulation layer 320 of the second thin-film encapsulation pattern 300B may be apart from each other with the groove G therebetween. In an embodiment, the second inorganic encapsulation layer 330 of the first thin-film encapsulation pattern 300A and the second inorganic encapsulation layer 330 of the second thin-film encapsulation pattern 300B may be apart from each other. The second inorganic encapsulation layer 330 of the first thin-film encapsulation pattern 300A and the second inorganic encapsulation layer 330 of the second thin-film encapsulation pattern 300B may be apart from each other with the groove G therebetween.

The first inorganic encapsulation layer 310 of the first thin-film encapsulation pattern 300A and the first inorganic encapsulation layer 310 of the second thin-film encapsulation pattern 300B may be connected to each other. The first inorganic encapsulation layer 310 may be formed using a chemical vapor deposition ("CVD") and may have a relatively high step coverage. Thus, the first inorganic encapsulation layer 310 may cover the inside of the groove G entirely. A portion for covering the inside of the groove G of the first inorganic encapsulation layer 310 may be formed to a smaller thickness than the thickness of a portion of the first inorganic encapsulation layer 310 in the display area DA.

Figure 4:
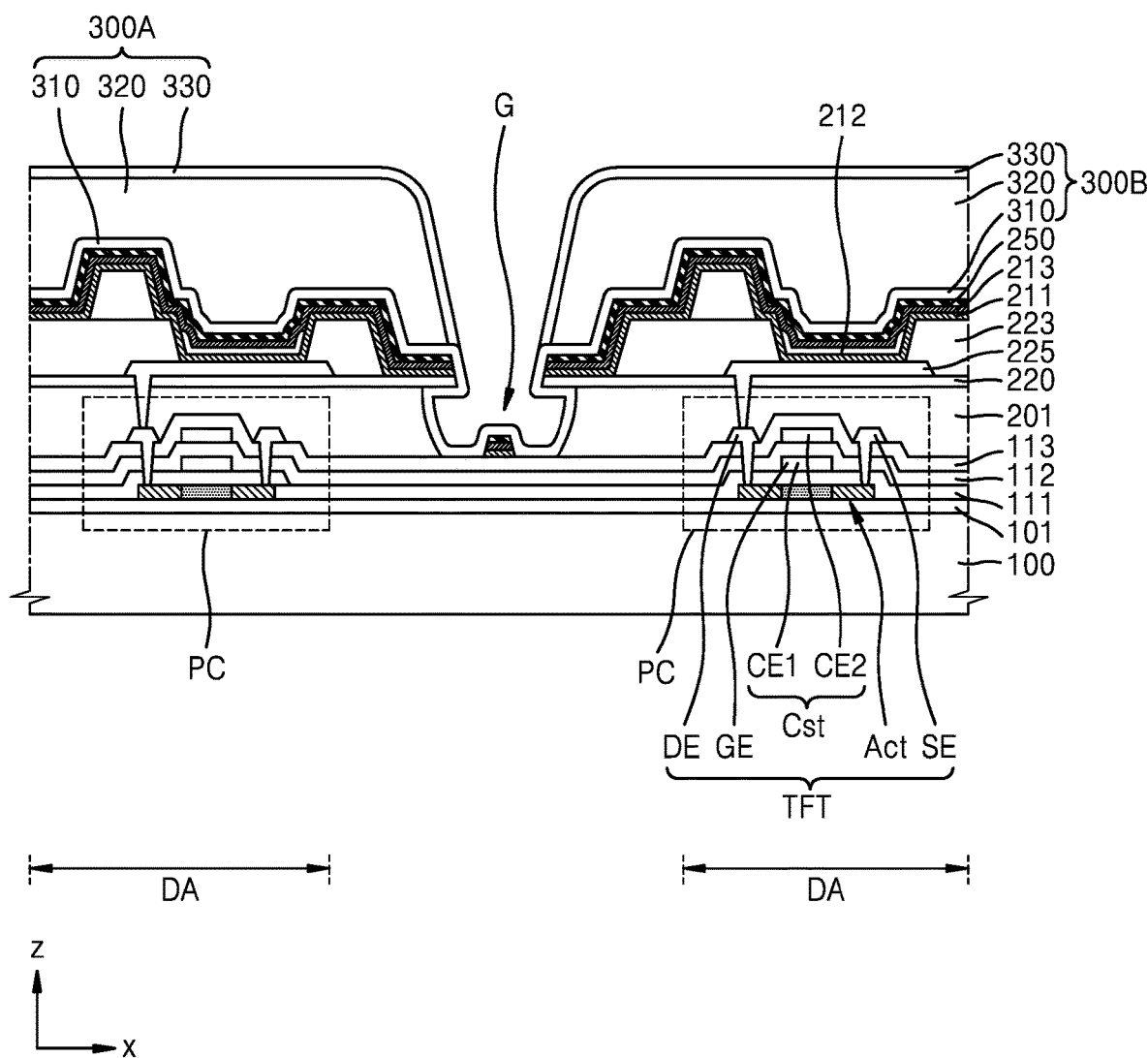
FIG. 4 is a cross-sectional view of a display device according to an alternative embodiment.

FIG. 4 is a cross-sectional view of the display device 10 according to various embodiments. Particularly, FIG. 4 may correspond to a cross-section of the display device 10 taken along line B-B' of FIG. 1A, according to an alternative embodiment.

The embodiment of FIG. 4 is substantially the same as the embodiments described above with reference to FIGS. 3A and 3B, except for the groove G and a peripheral structure thereof. The same or like elements shown in FIG. 4 have been labeled with the same reference characters as used above to describe the embodiments of the display device 10 shown in FIGS. 3A and 3B, and any repetitive detailed description thereof will hereinafter be omitted or simplified.

In an embodiment, the groove G is formed by openings defined through the first organic insulating layer 201 and the inorganic material layer 220, as described above with reference to FIGS. 3A and 3B. In such an embodiment, as show in FIG. 4, no opening is defined through at least one inorganic layer (for example, the gate insulating layer 111, the first interlayer insulating layer 112, and the second interlayer insulating layer 113) under the first organic insulating layer 201.

Figure 5:
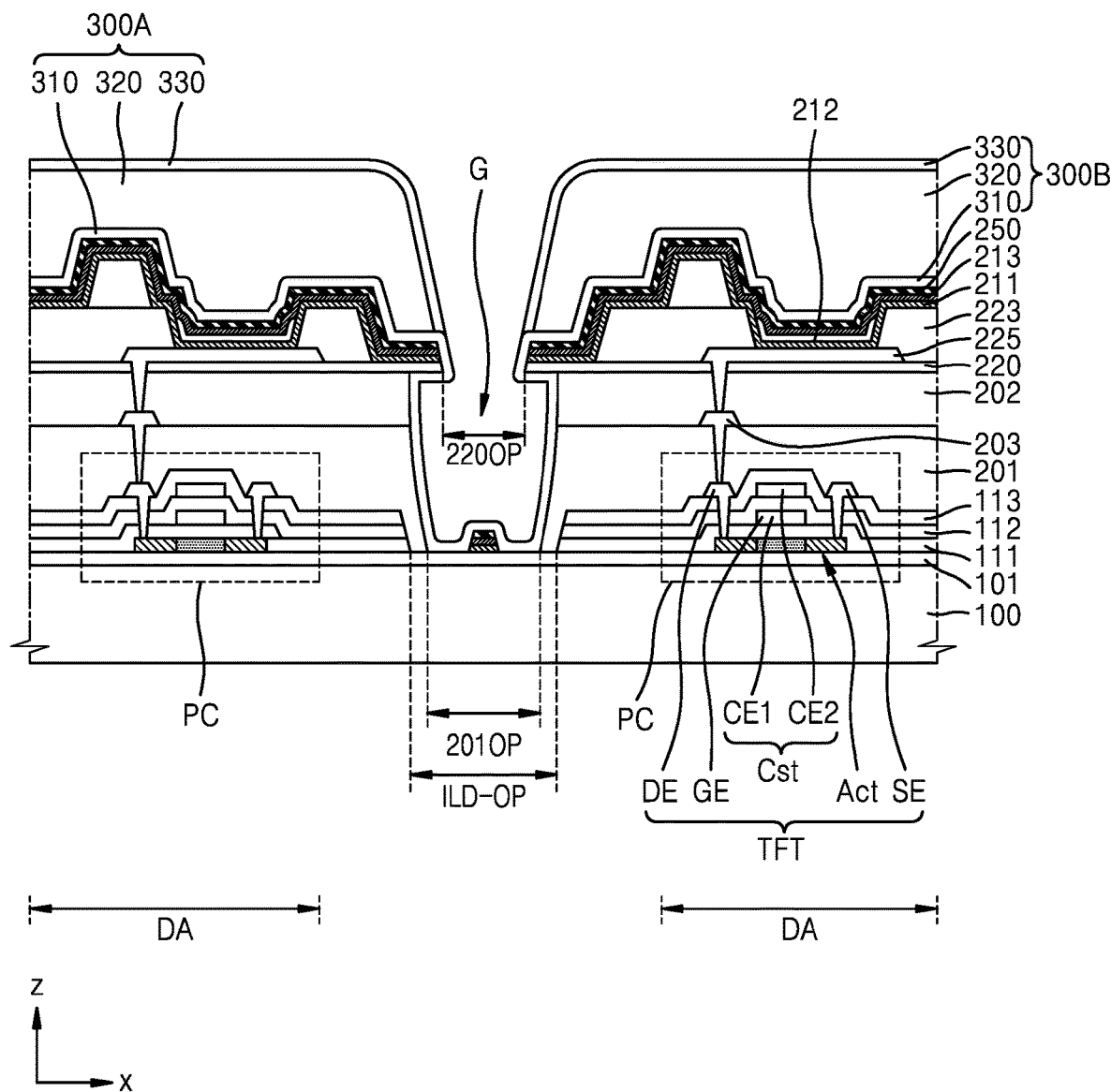
FIG. 5 is a cross-sectional view of a display device according to another alternative embodiment.
Figure 6:
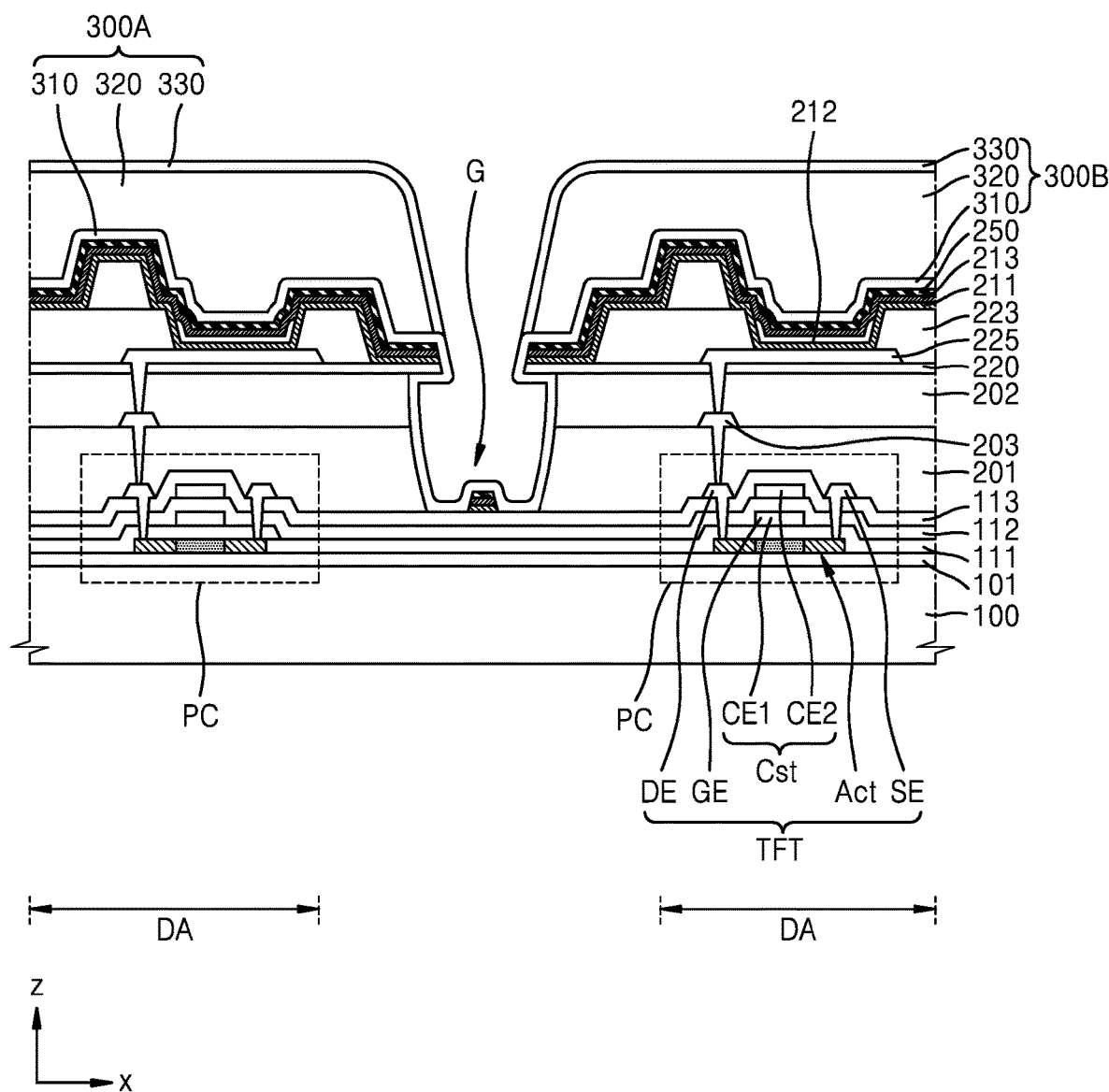
FIG. 6 is a cross-sectional view of a display device according to another alternative embodiment.

FIGS. 5 and 6 are respectively cross-sectional views of the display device 10 according to alternative embodiments. Particularly, each of FIGS. 5 and 6 may correspond to a cross-section of the display device 10 taken along line B-B' of FIG. 1A, according to another alternative embodiment.

Embodiments of FIGS. 5 and 6, is substantially the same as the embodiments described above with reference to FIGS. 3A and 3B, except for the groove G and a peripheral structure thereof. The same or like elements shown in FIGS. 5 and 6 have been labeled with the same reference characters as used above to describe the embodiments of the display device 10 shown in FIGS. 3A and 3B, and any repetitive detailed description thereof will hereinafter be omitted or simplified.

In an embodiment, a contact metal layer 203 for electrically connecting the thin-film transistor TFT to the pixel electrode 225 may be disposed on the first organic insulating layer 201. The contact metal layer 203 may include conductive materials including Mo, Al, Cu, and Ti and may have a multi-layer or single layer structure including the materials described above. In an embodiment, the contact metal layer 203 may have a multi-layer structure of Ti/Al/Ti in which a titanium layer, an aluminum layer and a titanium layer are sequentially stacked. A part of the contact metal layer 203 may be covered by a second organic insulating layer 202. The second organic insulating layer 202 may include an organic insulating material, such as acryl, benzocyclobutene ("BCB"), PI, or hexamethyldisiloxane ("HMDSO"). The second organic insulating layer 202 may be under the inorganic material layer 220. The pixel electrode 225 may be connected to the contact metal layer 203 via a contact hole defined in the second organic insulating layer 202 and the inorganic material layer 220.

The display device 10 may include the first and second thin-film encapsulation patterns 300A and 300B, which cover each of the display areas DA. The groove G may be defined or formed between the first and second thin-film encapsulation patterns 300A and 300B.

The groove G may be defined by the opening defined through the second organic insulating layer 202 and the first organic insulating layer 201 and the opening defined in the inorganic material layer 220 overlap each other. In such an embodiment, as described above with reference to FIGS. 3A and 3B, a width of the opening of the inorganic material layer 220 may be less than a width of the opening defined through the second organic insulating layer 202 and the first organic insulating layer 201. In In such an embodiment, the ends for defining the opening of the inorganic material layer 220 may further protrude toward the center of the groove G than insides of the second organic insulating layer 202 and the first organic insulating layer 201 and thus may form a tip. The opposite electrode 250, the first functional layer 211, and the second functional layer 213 are disconnected or separated from one another by the groove G having the undercut structure indicated with "U", as described above.

In an embodiment, an opening ILD-OP that overlaps the groove G, as shown in FIG. 5, may be defined through insulating layers between the substrate 100 and the first organic insulating layer 201, for example, the gate insulating layer 111, the first interlayer insulating layer 112, and the second interlayer insulating layer 113. Alternatively, no opening is defined through at least one layer selected from insulating layers between the substrate 100 and the first organic insulating layer 201, for example, the gate insulating layer 111, the first interlayer insulating layer 112, and the second interlayer insulating layer 113, as shown in FIG. 6.

Figure 7:
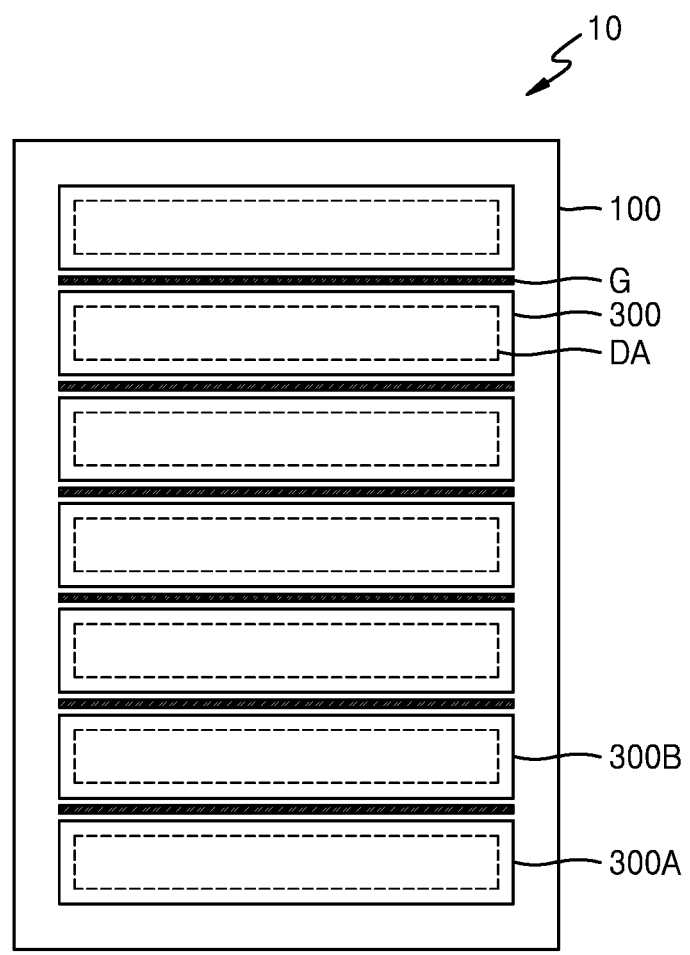
FIG. 7 is a plan view of a display device according to an alternative embodiment.

FIG. 7 is a plan view of the display device 10 according to an alternative embodiment.

Referring to FIG. 7, an embodiment of the display device 10 includes a plurality of thin-film encapsulation patterns 300 that cover each of the display areas DA, as described above with reference to FIGS. 1A through 6.

The groove G, as described with reference to FIGS. 3 through 6, is defined between adjacent thin-film encapsulation patterns and is between the adjacent display areas DA. The display device 10 may include a plurality of grooves G disposed in a separation space between the thin-film encapsulation patterns 300. Each of the grooves G may extend in parallel to the axis BL. The plurality of grooves G may be arranged to be apart from one another in a direction crossing the axis BL.

Figure 8:
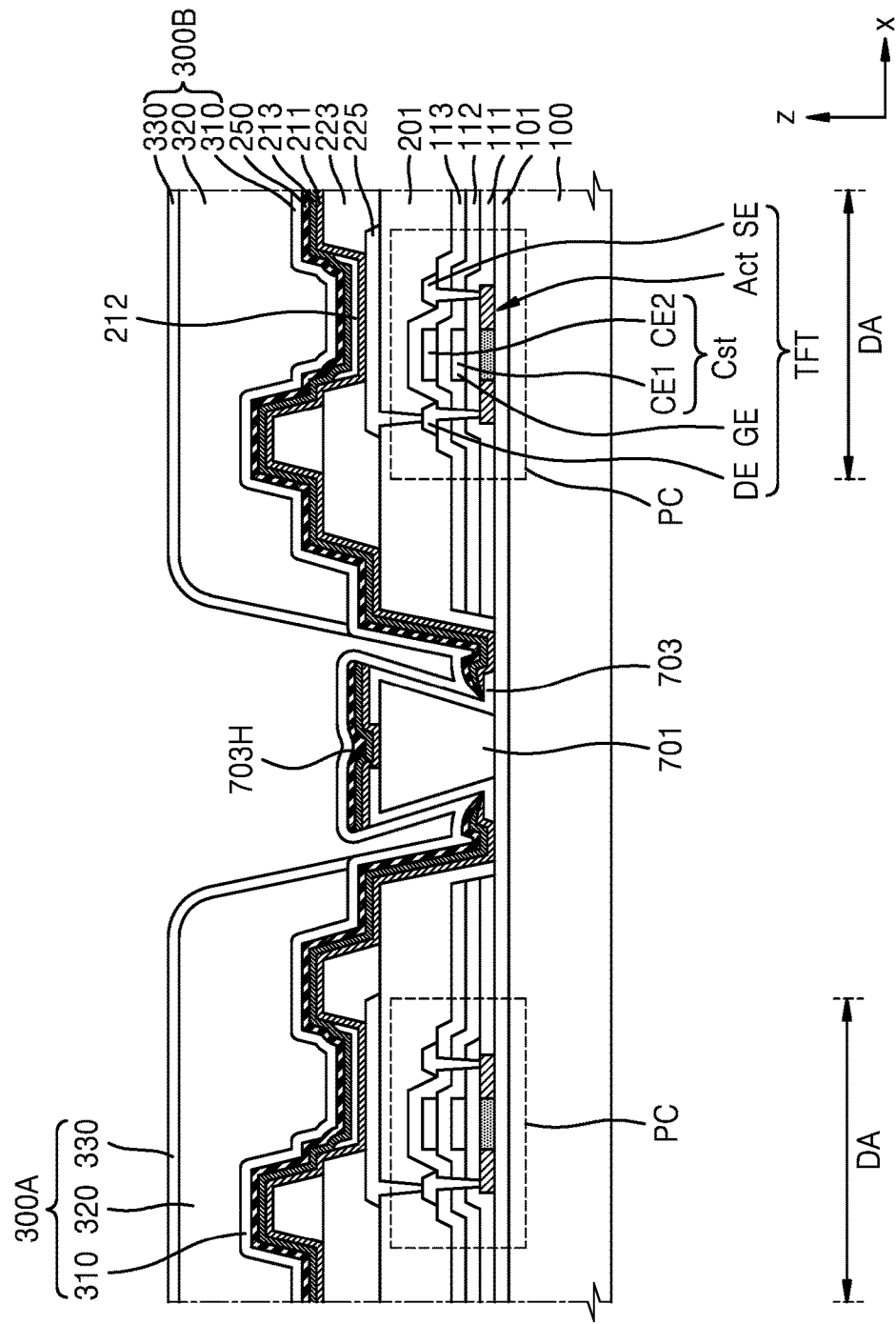
FIG. 8 is a cross-sectional view of a display device according to an embodiment.

FIG. 8 is a cross-sectional view of the display device 10 according to an embodiment. Particularly, FIG. 8 may be a cross-sectional view of the display device 10 taken along line B-B' of FIG. 1A, according to an alternative embodiment.

Referring to FIG. 8, in an embodiment, first and second thin-film encapsulation patterns 300A and 300B that cover display elements are in each of the display areas DA. Structures of the first and second thin-film encapsulation patterns 300A and 300B are substantially the same as those described above with reference to FIGS. 3A and 3B.

In an embodiment, as shown in FIG. 8, a separator 701 may be disposed between the adjacent first and second thin-film encapsulation patterns 300A and 300B, and the separator 701 includes a reversely-tapered inclined surface. The cross-section of the separator 701 may have a reversed trapezoidal shape.

The separator 701 may be positioned on an inorganic insulating material, for example, the buffer layer 101.

The separator 701 may include an organic material. The separator 701 may include an organic material that is different from the first organic insulating layer 201. The separator 701 may include photosensitive resin, for example, a negative photoresist.

The separator 701 may be covered by an inorganic protective layer 703. In one embodiment, for example, a hole 703H is defined through a portion of the inorganic protective layer 703 that corresponds to a top surface of the separator 701. The hole 703H may be used as a passage for discharging gas generated in the separator 701 that is an organic material during a manufacturing process of the display device 10 and/or after the display device 10 is manufactured. In one embodiment, for example, the hole 703H of the inorganic protective layer 703 may be an outgassing passage.

In an embodiment, the opposite electrodes 250 may be disconnected or separated from each other according the reversely-tapered structure of the separator 701. In such an embodiment, the first functional layer 211 and/or the second functional layer 213 may be disconnected or separated from each other by the separator 701.

Each of the organic encapsulation layer 320 of the first thin-film encapsulation pattern 300A and the second inorganic encapsulation layer 330 may be apart from each of the organic encapsulation layer 320 of the second thin-film encapsulation pattern 300B and the second inorganic encapsulation layer 330.

The first inorganic encapsulation layer 310 of the first thin-film encapsulation pattern 300A may be connected to the first inorganic encapsulation layer 310 of the second thin-film encapsulation pattern 300B. In one embodiment, for example, the first inorganic encapsulation layer 310 of the first thin-film encapsulation pattern 300A and the first inorganic encapsulation layer 310 of the second thin-film encapsulation pattern 300B may be connected to each other while covering sides and the top surface of the separator 701.

Figure 9:
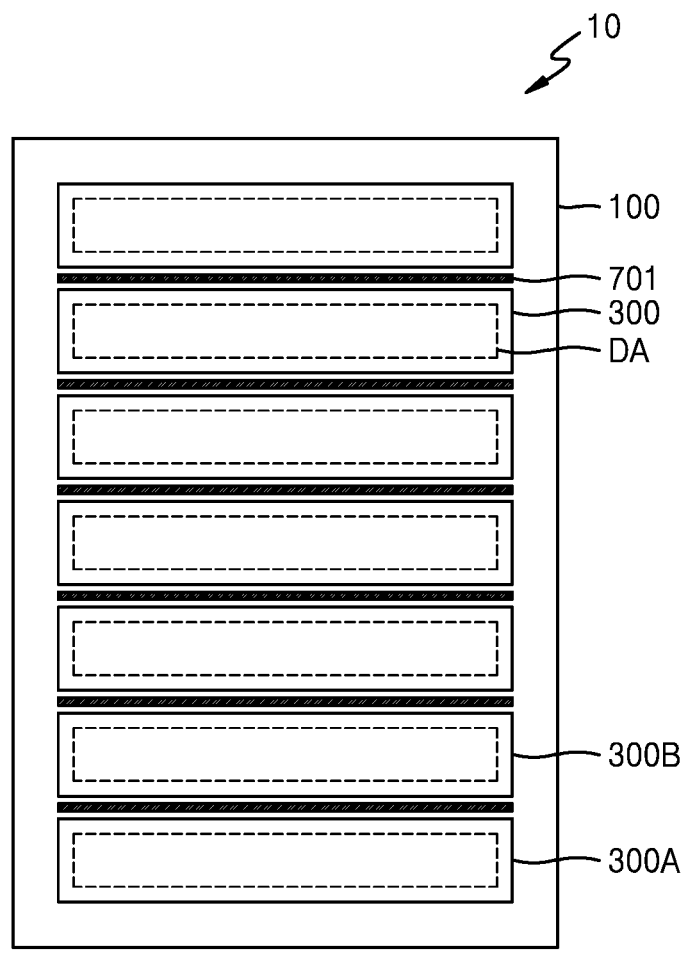
FIG. 9 is a plan view of a display device according to an embodiment.

FIG. 9 is a plan view of the display device 10 according to another alternative embodiment.

Referring to FIG. 9, the display device 10 includes a plurality of thin-film encapsulation patterns 300 that cover each of the display areas DA, as described above with reference to FIGS. 1A through 6.

The separator 701 described above with reference to FIG. 8 may be positioned between the adjacent thin-film encapsulation patterns 300. The separator 701 may be positioned between the adjacent display areas DA. The display device 10 may include a plurality of separators 701 in the separation space between the thin-film encapsulation patterns 300. Each of the plurality of separators 701 extends in parallel to the axis BL. The plurality of separators 701 may be arranged to be apart from one another in the direction crossing the axis BL.

According to embodiments of the invention, as set forth therein, cracks may be effectively prevented from occurring in an inorganic material layer of a flexible display device or may be minimized by including a structure of a plurality of inorganic material layers arranged in parallel to an axis and which may have enhanced durability. However, the scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A flexible display device comprising:
a substrate which is bendable or rollable based on an axis;
a plurality of display elements on the substrate; and
a plurality of thin-film encapsulation patterns which covers the plurality of display elements, wherein
the plurality of thin-film encapsulation patterns comprise a first thin-film encapsulation pattern and a second thin-film encapsulation pattern, which are apart from each other in a direction crossing the axis, and
each of the first thin-film encapsulation pattern and the second thin-film encapsulation pattern extends in parallel to the axis of the flexible display device,
a groove having an undercut structure defined between the first thin-film encapsulation pattern and the second thin-film encapsulation pattern,
wherein the groove is not defined in the substrate, and
wherein the groove extends in parallel to the axis of the flexible display device.

2. The flexible display device of claim 1, wherein each of the first thin-film encapsulation pattern and the second thin-film encapsulation pattern comprises an organic encapsulation layer and an inorganic encapsulation layer.

3. The flexible display device of claim 1, wherein each of the first thin-film encapsulation pattern and the second thin-film encapsulation pattern comprises a first inorganic encapsulation layer, an organic encapsulation layer, and a second inorganic encapsulation layer, which are sequentially stacked one on another, the organic encapsulation layer of the first thin-film encapsulation pattern and the organic encapsulation layer of the second thin-film encapsulation pattern are apart from each other, and the second inorganic encapsulation layer of the first thin-film encapsulation pattern and the second inorganic encapsulation layer of the second thin-film encapsulation pattern are apart from each other.

4. The flexible display device of claim 3, wherein the first inorganic encapsulation layer of the first thin-film encapsulation pattern and the first inorganic encapsulation layer of the second thin-film encapsulation pattern are connected to each other.

5. The flexible display device of claim 1, further comprising:

a first organic insulating layer between the substrate and the plurality of display elements, wherein an opening is defined through a portion of the first organic insulating layer between the first thin-film encapsulation pattern and the second thin-film encapsulation pattern.

6. The flexible display device of claim 1, wherein each of the plurality of display elements comprises a pixel electrode, an emission layer on the pixel electrode, and an opposite electrode on the emission layer, and opposite electrodes of adjacent display elements are disconnected or separated from each other between the first thin-film encapsulation pattern and the second thin-film encapsulation pattern.

7. The flexible display device of claim 6, wherein the opposite electrodes of the adjacent display elements are disconnected or separated from each other by the groove.

8. The flexible display device of claim 7, wherein each of the plurality of display elements further comprises a functional layer between the pixel electrode and the opposite electrode, and the functional layer of each of the plurality of display elements is disconnected or separated from the functional layer of an adjacent display element thereof by the groove.

9. A flexible display device comprising:

a substrate which is bendable or rollable based on an axis;
a plurality of display elements on the substrate;
a plurality of thin-film encapsulation patterns which covers the plurality of display elements; and
a separator having a reversely-tapered inclined surface, wherein the plurality of thin-film encapsulation patterns comprise a first thin-film encapsulation pattern and a second thin-film encapsulation pattern, which are apart from each other in a direction crossing the axis, each of the first thin-film encapsulation pattern and the second thin-film encapsulation pattern extends in parallel to the axis of the flexible display device, and the separator is disposed between the first thin-film encapsulation pattern and the second thin-film encapsulation pattern, and wherein the separator extends in parallel to the axis of the flexible display device.

10. The flexible display device of claim 9, wherein each of the plurality of display elements further comprises a functional layer between the pixel electrode and the opposite electrode, and the functional layer of each of the plurality of display elements is disconnected or separated from the functional layer of adjacent display element thereof by the separator.

11. The flexible display device of claim 9, wherein the opposite electrodes of the adjacent display elements are disconnected or separated from each other by the separator.

12. A flexible display device comprising:

a substrate which is bendable or rollable based on an axis;
a plurality of display elements on the substrate; and
a plurality of thin-film encapsulation patterns which covers the plurality of display elements and is arranged to be apart from one another in a direction crossing the axis, wherein a groove having an undercut structure is defined between adjacent thin-film encapsulation patterns of the plurality of thin-film encapsulation patterns, wherein the groove is not defined in the substrate, and wherein the groove extends in parallel to the axis of the flexible display device.

13. The flexible display device of claim 12, wherein each of the plurality of display elements comprises a pixel electrode, an emission layer on the pixel electrode, and an opposite electrode on the emission layer, and opposite electrodes of adjacent display elements of the plurality of display elements are disconnected or separated from each other by the groove.

14. The flexible display device of claim 13, wherein each of the plurality of display elements further comprises a functional layer between the pixel electrode and the opposite electrode, and the functional layer of each of the plurality of display elements is integrally formed as a single unitary unit, and is disconnected or separated from the functional layer of an adjacent display element thereof by the groove.

15. The flexible display device of claim 12, wherein each of the plurality of thin-film encapsulation patterns comprises a first inorganic encapsulation layer, an organic encapsulation layer, and a second inorganic encapsulation layer, which are sequentially stacked one on another, and first inorganic encapsulation layers of the adjacent thin-film encapsulation patterns are connected to each other.

16. The flexible display device of claim 15, wherein organic encapsulation layers of the adjacent thin-film encapsulation patterns are apart from each other, and second inorganic encapsulation layers of the adjacent thin-film encapsulation patterns are apart from each other.

* * * * *